United States Patent
Shim et al.

(10) Patent No.: US 10,788,337 B2
(45) Date of Patent: Sep. 29, 2020

(54) METHOD OF OUTPUTTING LEVEL OF CAPACITIVE LEVEL SENSOR

(71) Applicants: HYUNDAI MOTOR COMPANY, Seoul (KR); KIA MOTORS CORPORATION, Seoul (KR); Sejong Industrial Co., Ltd., Ulsan (KR)

(72) Inventors: Hyo Sub Shim, Suwon-si (KR); Bu Kil Kwon, Suwon-si (KR); Ho Cheol Suh, Yongin-si (KR); Seok Yun Jang, Yongin-si (KR)

(73) Assignees: Hyundai Motor Company, Seoul (KR); Kia Motors Corporation, Seoul (KR); Sejong Industrial Co., Ltd., Ulsan (KR)

( * ) Notice: Subject to any disclaimer, the term of this patent is extended or adjusted under 35 U.S.C. 154(b) by 76 days.

(21) Appl. No.: 15/707,701

(22) Filed: Sep. 18, 2017

(65) Prior Publication Data
US 2018/0238715 A1 Aug. 23, 2018

(30) Foreign Application Priority Data
Feb. 22, 2017 (KR) .......................... 10-2017-0023384

(51) Int. Cl.
| | |
|---|---|
| *G01D 5/24* | (2006.01) |
| *G01F 23/26* | (2006.01) |
| *G01R 27/26* | (2006.01) |
| *G01F 23/00* | (2006.01) |
| *C01B 3/32* | (2006.01) |

(52) U.S. Cl.
CPC ............ *G01D 5/24* (2013.01); *G01F 23/0076* (2013.01); *G01F 23/263* (2013.01); *G01F 23/265* (2013.01); *G01F 23/266* (2013.01); *G01R 27/2605* (2013.01); *C01B 3/32* (2013.01)

(58) Field of Classification Search
CPC ......... G01F 23/261; G01F 23/265–268; G01F 23/263
USPC ........................................ 324/658; 73/304 C
See application file for complete search history.

(56) References Cited

U.S. PATENT DOCUMENTS

| | | | | | |
|---|---|---|---|---|---|
| 5,103,368 | A | * | 4/1992 | Hart ...................... | G01F 23/268 361/284 |
| 6,016,697 | A | * | 1/2000 | McCulloch ........... | G01F 23/266 |
| 6,101,873 | A | * | 8/2000 | Kawakatsu ........... | G01F 23/268 |

(Continued)

FOREIGN PATENT DOCUMENTS

| | | |
|---|---|---|
| JP | 2005-538349 A | 12/2005 |
| JP | 2007-205811 A | 8/2007 |

(Continued)

*Primary Examiner* — Patrick Assouad
*Assistant Examiner* — Demetrius R Pretlow
(74) *Attorney, Agent, or Firm* — Morgan, Lewis & Bockius LLP

(57) ABSTRACT

The present invention provides a method of outputting a level of a capacitive level sensor which may be provided in a water trap of a fuel cell system and the method of outputting a level of a capacitive level sensor including a level sensor including a plurality of electrodes for measuring capacitance, and an upper electrode and a lower electrode which are able to be disposed adjacent to each other in the level sensor, including: (a) measuring a change in an output value of the lower electrode; and (b) measuring a change in an output value of the upper electrode.

8 Claims, 5 Drawing Sheets

[ OUTPUT FLOWCHART WHEN WATER LEVEL RISES ]

(56) References Cited

U.S. PATENT DOCUMENTS

| | | | | |
|---|---|---|---|---|
| 6,138,508 A * | 10/2000 | Hannan | | G01F 23/265 |
| | | | | 324/665 |
| 7,284,427 B2 * | 10/2007 | Calabrese | | G01F 23/266 |
| | | | | 73/290 R |
| 8,474,315 B2 * | 7/2013 | Ohshima | | G01F 23/268 |
| 8,552,752 B2 * | 10/2013 | Qiu | | G01F 23/26 |
| | | | | 324/658 |
| 9,903,748 B1 * | 2/2018 | Lo | | G01F 23/266 |
| 2005/0280424 A1 * | 12/2005 | Qu | | G01F 23/265 |
| | | | | 324/663 |
| 2006/0053880 A1 * | 3/2006 | Taylor | | G01F 23/0069 |
| 2007/0125172 A1 * | 6/2007 | Vanderzee | | G01F 23/263 |
| 2009/0148306 A1 * | 6/2009 | Drechsel | | F04B 49/02 |
| | | | | 417/36 |
| 2009/0153150 A1 * | 6/2009 | Slezak | | G01F 23/243 |
| | | | | 324/663 |
| 2010/0154534 A1 * | 6/2010 | Hampton | | G01F 23/265 |
| 2011/0113878 A1 * | 5/2011 | Ohshima | | G01F 23/266 |
| 2011/0314907 A1 * | 12/2011 | Wiedekind-Klein | | |
| | | | | G01F 23/268 |
| 2012/0291541 A1 * | 11/2012 | Liu | | G01F 23/26 |
| 2014/0020463 A1 * | 1/2014 | Ikeya | | G01F 23/263 |
| 2015/0235546 A1 * | 8/2015 | Stapleford | | G08B 21/182 |
| | | | | 340/618 |
| 2016/0041021 A1 * | 2/2016 | Saitou | | G01F 23/26 |
| 2017/0261361 A1 * | 9/2017 | Rondano | | G01F 23/26 |
| 2018/0023993 A1 * | 1/2018 | Philipson | | D06F 39/087 |
| 2018/0080808 A1 * | 3/2018 | Naydenov | | G01F 23/268 |

FOREIGN PATENT DOCUMENTS

| | | |
|---|---|---|
| JP | 2008-235051 A | 10/2008 |
| JP | 2014-142240 A | 8/2014 |
| JP | 2014-144240 A | 8/2014 |
| JP | 2015-508491 A | 3/2015 |
| KR | 10-0848037 B1 | 7/2008 |
| KR | 10-2010-0136872 A | 12/2010 |

* cited by examiner

| SITUATION | NO WATER IN UPPER/LOWER ELECTRODE | WATER FLOWS IN LOWER ELECTRODE | WATER IS FILLED IN LOWER ELECTRODE AND THEREAFTER, WATER IS POSITIONED BETWEEN UPPER AND LOWER ELECTRODES | WATER FLOWS IN UPPER ELECTRODE OUTPUT WATER LEVEL |
|---|---|---|---|---|
| IMAGE |  |  | 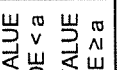 |  |
| CONDITION | CHANGE IN OUTPUT VALUE OF LOWER ELECTRODE < a<br>CHANGE IN OUTPUT VALUE OF UPPER ELECTRODE < a | CHANGE IN OUTPUT VALUE OF LOWER ELECTRODE ≥ a<br>CHANGE IN OUTPUT VALUE OF UPPER ELECTRODE < a | CHANGE IN OUTPUT VALUE OF LOWER ELECTRODE < a<br>CHANGE IN OUTPUT VALUE OF UPPER ELECTRODE < a | CHANGE IN OUTPUT VALUE OF LOWER ELECTRODE < a<br>CHANGE IN OUTPUT VALUE OF UPPER ELECTRODE ≥ a |

FIG. 2

[ OUTPUT FLOWCHART WHEN WATER LEVEL RISES ]

METHOD OF OUTPUTTING LEVEL OF CAPACITIVE LEVEL SENSOR

CROSS-REFERENCE TO RELATED APPLICATION

This application claims under 35 U.S.C. § 119(a) the benefit of priority to Korean Patent Application No. 10-2017-0023384 filed on Feb. 22, 2017, the entire contents of which are incorporated herein by reference.

BACKGROUND

(a) Technical Field

The present disclosure relates to a method of outputting a level of a capacitive level sensor, and more particularly, to a method of calculating an actual water level while in the capacitive level sensor the water level rises or falls according to a change in output values of a plurality of electrodes which are arranged to be adjacent to an upper/lower part of a capacitive level sensor.

(b) Background Art

Among main components of a fuel cell system, a fuel cell stack as a kind of power generation device chemically reacts hydrogen supplied from the outside with oxygen in the air to generate electric energy.

That is, the hydrogen supplied to the fuel cell stack is separated into hydrogen ions and electrons in a catalyst of an anode, the separated hydrogen ions flow over to a cathode through an electrolyte membrane, and the oxygen subsequently supplied to the cathode is coupled with the electrons which enter the cathode through an external wire to generate electric energy while generating water.

In the reaction of the fuel cell stack, gas output from an outlet of the anode of the fuel cell stack includes a large amount of condensed water which comes cross from the anode and when the condensed water is not smoothly discharged, the condensed water is accumulated in the fuel cell stack as it is to interfere with the reaction of the hydrogen, and as a result, output and operation stabilities of the fuel cell stack are impeded. Therefore, a water trap for removing the condensed water in the anode is installed in the fuel cell system. As a result, the water generated from the fuel cell stack drops down by gravity in terms of a design structure of the fuel cell stack and the water which drops down is collected in a water trap device.

When the water trap device collects the condensed water and the collected condensed water becomes at a predetermined level or more, the water trap device may serve to discharge the condensed water to the outside through a drain valve installed at one end of the water trap, etc. That is, when the water generated from the fuel cell stack drops due to the gravity and a predetermined amount or more of water is stored in the water trap, the water is sensed by a highest level sensor, and as a result, the water is discharged to the outside by opening a drain valve on the bottom of the water trap.

However, in the case where the highest level of the water stored in the water trap device is sensed through a capacitive level sensor, when an internal temperature of the water trap increases apart from a malfunction by an increase in amount of the water, the capacitive level sensor may malfunction due to a high-temperature state. As a result, a situation may occur, in which the level in the water trap is measured to be higher than an actual level, and as a result, the drain valve is unnecessarily opened.

The above information disclosed in this Background section is only for enhancement of understanding of the background of the invention and therefore it may contain information that does not form the related art that is already known in this country to a person of ordinary skill in the art.

SUMMARY OF THE DISCLOSURE

The present invention has been made in an effort to solve the above-described problems associated with the conventional art.

Thus, the present invention provides a method of outputting a level of a capacitive level sensor, in which a change in output values of a plurality of electrodes is compared with a predetermined value to prevent a temperature-caused malfunction of a level sensor and to output an actual water level.

In one aspect, the present invention provides a method of outputting a level of a capacitive level sensor including a level sensor including a plurality of electrodes for measuring capacitance, in which the plurality of electrodes are divided into upper electrodes and lower electrodes and disposed to be adjacent to each other, the method, including: (a) measuring a change in an output value of the lower electrodes; and (b) measuring the change in the output value of the upper electrodes.

In a preferred embodiment, when output values of the lower electrodes are changed to be less than a predetermined value and output values of the upper electrodes are changed to be equal to or greater than the predetermined value, water level with respect to the upper electrodes may be output.

In another aspect, the present invention provides a method of outputting a level of a capacitive level sensor including a level sensor including a plurality of electrodes for measuring capacitance, in which the plurality of electrodes are divided into upper electrodes and lower electrodes and disposed to be adjacent to each other, the method including: (a) measuring a change in the output values of the upper electrodes; and (b) measuring the change in the output values of the lower electrodes.

In a preferred embodiment, when the output value of the upper electrode is changed to be less than a predetermined value and the output value of the lower electrode is changed to be equal to or more than the predetermined value, water level with respect to the lower electrode may be output.

In another preferred embodiment, the level sensor may further include a micro control unit (MCU) receiving measured values from the plurality of electrodes, wherein the MCU may periodically measure a change in the output values of the electrodes.

In still another preferred embodiment, the plurality of electrodes of the level sensor have predetermined corresponding output values.

In yet another preferred embodiment, a bottom height of each electrode may be set as the output value.

By the method, the present invention provides the following effects.

According to the present invention, even in a state where an internal temperature of a water trap is high, it can be determined whether the water level, which is measured by a capacitive level sensor is the actual water level or not.

A temperature sensor may not be provided in the water trap to prevent a malfunction occurring by high temperature inside the water trap. As a result, the configuration of a fuel cell water trap may be simple.

As compared with the analogue method where a level sensor is provided in a water trap, According to the present invention, a drain valve may be open at an appropriate time by rapidly responding to level-measuring requirement to discharge water outside. A fuel cell system or stack can be, accordingly, prevented from being damaged by excessive moisture resulting from a wrongly measured water level.

Other aspects and preferred embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein:

FIG. 2 illustrates output values of electrodes according to an exemplary embodiment of the present invention and is a table showing various cases in which output values of electrodes disposed to be adjacent to upper and lower parts may be changed according to an actual water level;

Figure 1:
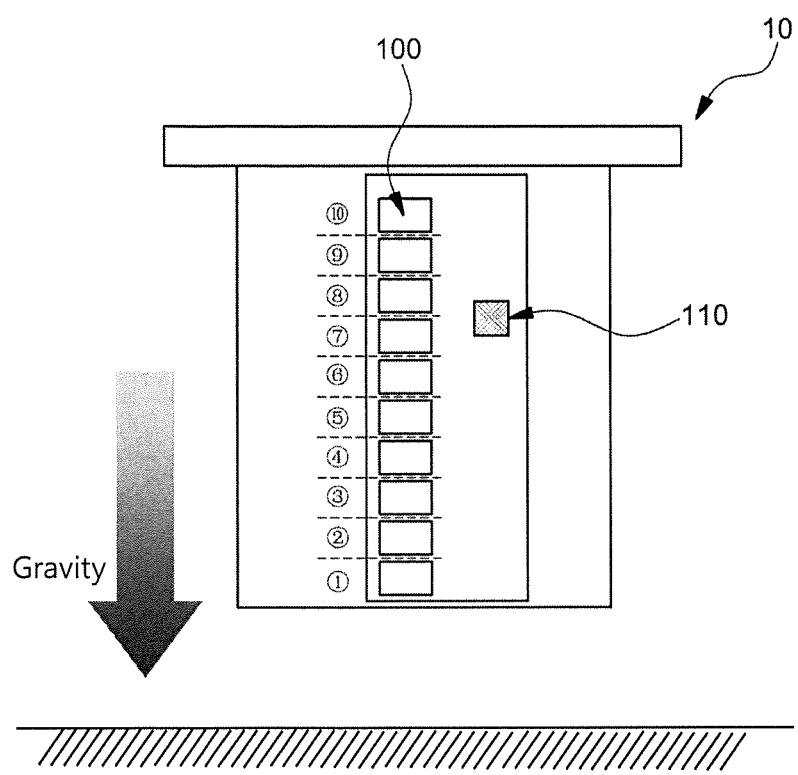
FIG. 1 shows a diagram illustrating the configuration of a capacitive level sensor including a plurality of electrodes according to an exemplary embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, an embodiment of the present invention will be described in more detail with reference to the accompanying drawings. The embodiment of the present invention can be modified in various forms, and it should not be construed that the scope of the present invention is limited to embodiments described below. The embodiments are provided to more completely describe the present invention to those skilled in the art.

Terms including "part", "unit", "module", and the like disclosed in the specification mean a unit that processes at least one function or operation and this may be implemented by hardware or software or a combination of hardware and software.

A fuel cell system mounted on a vehicle may be configured to generally include a fuel cell stack generating electric energy, a fuel cell supply device supplying fuel (hydrogen) to the fuel cell stack, an air supply device supplying oxygen in the air, which is an oxidizer required for an electrochemical reaction to the fuel cell stack, a cooling system removing reaction heat of the fuel cell stack to the outside of the system and controlling an operation temperature of the fuel cell stack, and a control unit capable of controlling opening/closing a plurality of valves provided in the fuel cell system.

When a component in a part where water generated from the fuel cell stack is discharged among components of the fuel cell system is described, a water trap 10 (FIG. 1) connected with the fuel cell stack and a drain valve which is not illustrated in a drawing, but may be connected to the outside at one end of the water trap 10, preferably, on a lower end may exist in the fuel cell system.

The water trap 10 is configured to temporarily store condensed water generated in the fuel cell stack and discharge all together outside. Accordingly when the drain valve is opened, the water in the water trap 10 may be discharged outside by gravity. However, since a period and/or a frequency of opening the drain valve may influence the efficiency of the fuel cell system, it is important to open the valve at an accurate time when the drain valve is actually required to be open.

In other words, if the drain valve is opened despite no water (condensed water) in the water trap 10, hydrogen in the fuel cell system may be unnecessarily released outside through the drain valve so that fuel efficiency of the vehicle may be negatively influenced. Further, even though a large amount of water is generated in the water trap 10, when the generated water is not discharged outside, the fuel cell system may be damaged by the excessive moisture and flooding in the fuel cell stack.

Therefore, a sensor for measuring water level inside the water trap 10 may be provided on one surface of the water trap 10. The water trap 10 according to an exemplary embodiment of the present invention may include a capacitive level sensor and preferably, may include the capacitive level sensor including a plurality of electrodes 100 on one inner wall surface of the water trap 10.

The capacitive level sensor according to the exemplary embodiment of the present invention may include a micro control unit (MCU) 110 maybe an electronic circuitry that performs various functions explained below. The MCU 110 may collect output values measured by the electrodes 100 and values associated therewith and may control the opening of the drain valve based on the output values.

FIG. 1 is a diagram illustrating the configuration of a capacitive level sensor including a plurality of electrodes 100 according to an exemplary embodiment of the present invention. Referring to FIG. 1, the capacitive level sensor according to the present invention may include the plurality of electrodes 100. The plurality of electrodes 100 may be arranged in line and preferably, may be arranged in a column in a gravity direction.

the plurality of electrodes 100 have predetermined corresponding output values. Preferably, the output values may be values corresponding to bottom height of the electrodes 100. Therefore, among the plurality of electrodes 100, an electrode 100 disposed at a low part (e.g. electrode ①) may have a relatively low output value and an electrode 100 disposed at a high part (e.g. electrode ⑩) may have a relatively high output value. Furthermore, the plurality of electrodes 100 (① to ⑩) may have different output values from each other. That is, each of the plurality of electrodes 100 may have an output value corresponding to the bottom height thereof as water level (see FIG. 5).

Hereinafter, referring to FIGS. 2 to 4, a method of outputting a level of a capacitive level sensor according to an exemplary embodiment of the present invention will be described in detail. In the method of outputting the level of a capacitive level sensor according to the exemplary embodiment of the present invention, first, a change in the output values of the plurality of electrodes 100 may be measured. In detail, the MCU 110 may keep periodically measuring the change X in the output values of the plurality of electrodes 100. Further, according to the exemplary embodiment of the present invention, the time taken to measure the change X is predetermined to be at a short interval. That is, in the present invention, the change X may be measured at a predetermined time and the relevant measurement may be repeatedly and continuously executed at a predetermined interval.

When the area of one electrode among the plurality of electrodes 100 in the capacitive level sensor decreases as contacting air by the water, the output value may be changed to a predetermined value a or more. In other words, only when the area of one electrode exposed to the air is decreased by the water, the output value may be changed to the predetermined value a or more.

Therefore, in one electrode 100, when all surfaces of the electrode 100 are submerged in water or exposed to the air, the output value cannot be changed to the predetermined value a or more.

Therefore, the MCU 110 of the present invention may compare the change X in the output value of the electrode 100 with the predetermined value a, and as a result, it may be first determined whether the actual water level is positioned between a bottom height and a top height of the electrodes 100. Furthermore, the predetermined value a may vary according to a measurement unit and precision of a capacitance, furthermore, a scale of the fuel cell system.

The comparison of the change X in the output value of the electrode 100 and the predetermined value a may be based on the fact that a change in the measurement value of the electrodes 100 according to the rise of the water level as the water flows into the water trap 10 is different from the change in the measurement value of the electrode according to an increase in temperature. In other words, when the internal temperature of the water trap 10 is high, vapor pressure in the water trap 10 may increase and liquid droplets may be formed on the surface of the electrode 100 in the capacitive level sensor in the water trap 10. As a result, the electrode with liquid droplets has low output values even though the water level is not as much as high.

However, in a high-temperature high-humidity environment, a large quantity of liquid droplets may be formed, and as a result, one electrode may output the output value in which the change X in the electrode output value is equal to or more than the predetermined value a.

Therefore, in the present invention, in order to make that the value measured by the capacitive level sensor is acquired by the rise or drop of the actual water level more accurate, that is, by considering all cases including even the case where a large quantity of liquid droplets are generated, the actual water level may be predicted by comparing the change X in the output values of an upper electrode and a lower electrode which may be disposed adjacent to each other. The upper electrode and/or the lower electrode designated in the present invention are relative concepts and in the plurality of electrodes 100, an electrode disposed in a relatively upper part may be the upper electrode and an electrode disposed in a relatively lower part may be the lower electrode. Therefore, the electrodes 100 disposed at positions of ② to ⑨ of FIG. 1 may become the upper electrode or the lower electrode. FIG. 1 shows the embodiment that electrode ⑨ is upper electrode and electrode ② is lower electrode, and one of ordinary skill in the art would have understood that the present application may include other embodiments with such as ⑨ being the lower electrode and ② being the upper electrode.

FIG. 2 illustrates an output value of an electrode 100 according to an exemplary embodiment of the present invention and is a diagram illustrating showing output values of adjacent electrodes 100 disposed in upper and lower parts depending on a water level.

Referring to FIG. 2, when the water level is positioned below an upper electrode 100T and a lower electrode 100S, in both electrodes 100, the output value is changed to be a value equal to or less than the predetermined value a.

When the water level continuously rises and the actual water level exceeds the bottom height of the lower electrode, and as a result, the area of the lower electrode exposed to the air decreases, that is, when the lower electrode is immersed in the water, the output value of the lower electrode may be changed to be larger than the predetermined value a. However, in this case, since the water level does not reach the height of the upper electrode, the output value of the upper electrode may be changed to be smaller than the predetermined value a.

When the water is filled in the entirety of the lower electrode and thereafter, the water level does not yet reach the height of the upper electrode, the output values of the upper electrode and the lower electrode may be changed to be smaller than the predetermined value a similarly to an initial state (a state in which the water level does not reach the lowermost height of the lower electrode).

When the water level reaches the lowermost height of the upper electrode and the upper electrode starts to be immersed in the water, the output value of the upper electrode may be changed to be larger than the predetermined value a. In this case, since the entirety of the lower electrode is immersed in the water, the electrode output value of the lower electrode may be changed to be smaller than the predetermined value a.

Figure 3:
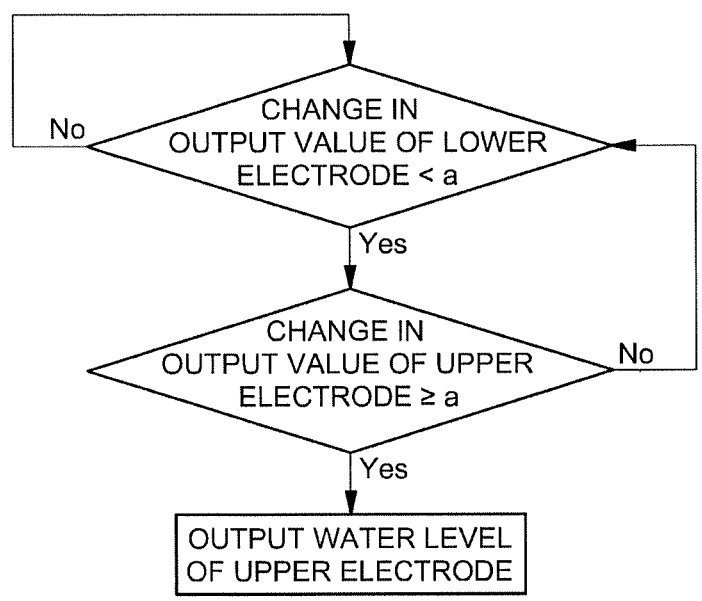
FIG. 3 shows a flowchart illustrating a process of outputting an actual water level when the water level in a water trap rises according to an exemplary embodiment of the present invention.

FIG. 3 is a flowchart illustrating a process of outputting an actual water level when the water level in a water trap 10 rises according to an exemplary embodiment of the present invention. Referring to FIG. 3, when the level rises, first, it may be determined whether the output value of the lower electrode is changed to be more than the predetermined value a.

When the output value of the lower electrode is changed to be more than the predetermined value a, a large quantity of droplets are formed in the relevant electrode or the actual water level exists at the height of the range of the relevant electrode, and as a result, the electrode output value is compared with another electrode value positioned below the lower electrode to determine whether the actual water level exists or whether a large quantity of droplets are formed. In this case, in identifying the actual water level, the lower electrode may become a criterion for determination as a new upper electrode.

On the contrary, when the output value of the lower electrode is changed not to be more than the predetermined value a, the output value of the upper electrode may be changed to be compared to the predetermined value a. In this case, when the output value of the upper electrode is changed to be equal to or less than the predetermined value a, the actual water level may be positioned below the lower electrode or at one point between the lower electrode and the upper electrode (corresponding to first and third cases of FIG. 2). Further, when the output value of the upper electrode is changed to be equal to or more than the predetermined value a, it may be determined that the actual water level is positioned at a predetermined height between the bottom height and the top height of the upper electrode. Therefore, the MCU 110 may determine the output value and the level (the bottom height of the upper electrode) corresponding to the upper electrode as actual water level.

Figure 4:
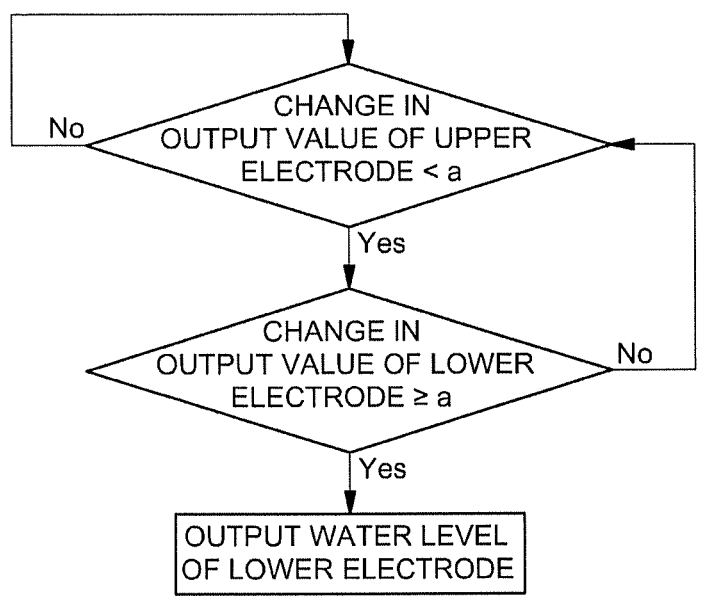
FIG. 4 shows a flowchart illustrating a process of outputting an actual water level when the water level in a water trap drops according to another exemplary embodiment of the present invention.

FIG. 4 is a flowchart illustrating a process of outputting a water level when the water level in a water trap 10 drops according to another exemplary embodiment of the present invention. When the water level falls, a process of outputting the actual water level may be a process of reversely determining the upper and lower electrodes and upper and lower concepts in a process of outputting the height of the surface of the water when the water level rises.

Referring to FIG. 4, when the level drops, first, it may be determined whether the output value of the upper electrode is changed to be more than the predetermined value a.

When the output value of the upper electrode is changed to be more than the predetermined value a, a large quantity of droplets are formed in the relevant electrode or the actual water level exists at the height of the range of the relevant electrode, and as a result, the electrode output value may be compared with another electrode value positioned above the upper electrode. In this case, in determining the height of the actual water level, the upper electrode may become the criterion for determination as the new lower electrode.

On the contrary, when the electrode output value of the upper electrode is changed not to be more than the predetermined value a, the output value of the lower electrode may be changed to be compared to the predetermined value a. In this case, when the output value of the lower electrode is changed to be equal to or less than the predetermined value a, the actual water level may be positioned above the upper electrode or one point between the lower electrode and the upper electrode (corresponding to the first and third cases of FIG. 2). Further, when the output value of the lower electrode is changed to be equal to or more than the predetermined value a, it may be determined that the actual water level is positioned at one predetermined point between the uppermost height and the lowermost height of the lower electrode. Therefore, the MCU 110 may determine the output value and the level (the bottom height of the lower electrode) corresponding to the lower electrode as the height of the actual water level.

Figure 5:
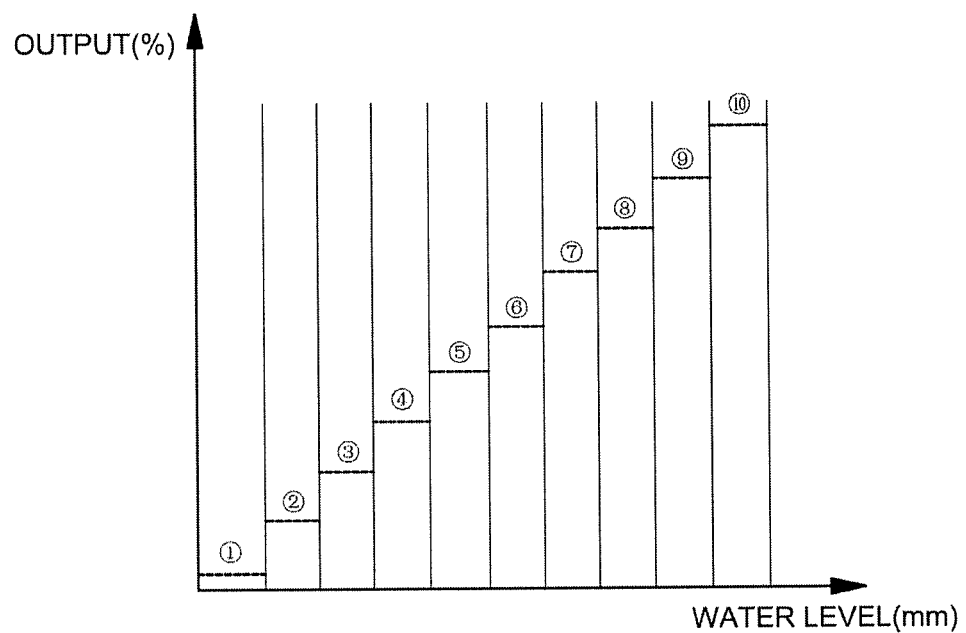
FIG. 5 shows a graph showing output values of a plurality of electrodes according to water level.

FIG. 5 is a graph illustrating output values of a plurality of electrodes 100 according to an exemplary embodiment of the present invention. In FIG. 5, a progress in which the output of the electrode value is changed depending on the water level is illustrated. That is, referring to FIGS. 1 to 5, electrodes arranged at positions of ① to ⑩ of FIG. 1 may output predetermined values (values corresponding to the bottom heights of the relevant electrodes) and it can be seen that the electrodes output the predetermined values according to the method for outputting the level of the electrode of FIGS. 3 and 4. As a result, the MCU 110 may determine the range of the actual water level based on the output value of the electrode.

However, referring to FIG. 5, it can be seen that a value output by one electrode has a predetermined output value as the bottom height of the relevant electrode in the present invention as described above. That is, according to the present invention, it can be seen that as the actual level rises, a stepwise output value is output.

The output form is associated with a characteristic of the water trap 10 and it may be important that it is determined within which range the actual water level is positioned rather than the case where measuring the precise water level is required in the water trap 10 to accurately determine a time when opening the drain valve is required or not.

That is, when a time and a process required for measuring the accurate water level are shortened, it is rapidly determined within which range the actual water level exists and when the water of a predetermined level or more comes up, the water trap 10 is used for discharging the water to the outside by opening the drain valve. Therefore, the capacitive level sensor of the water trap 10 mounted on the fuel cell system may require the level output method and component suitable for the corresponding purpose.

Therefore, in the present invention, rapid responsiveness may be secured as compared with an analog level sensor and in the related art, it may be accurately determined at which height the actual level in the water trap 10 is positioned while removing a temperature sensor required for following, preventing, and correcting misperception by the temperature.

To sum up, a core spirit of the present invention is characterized in that in the plurality of electrodes 100 of the capacitive level sensor, which may be disposed in the gravity direction, the change X in the output value of each of the upper and lower electrodes is changed to be compared to the predetermined value a to prevent misjudgment of the water level by the liquid droplets which may be generated at a high temperature. That is, misjudgment may not be distinguished by the height of the actual water level by one electrode value or by the liquid droplets in the water trap 10 in the high-temperature state, but in the present invention, it should be noted that the present invention is characterized in that accurate distinguishment can be made while removing the temperature sensor.

Embodiments of the present invention have been explained and described, but it will be appreciated by those skilled in the art that the present invention may be modified and changed in various ways without departing from the spirit of the present invention described in the claims by the addition, change, deletion or addition of constituent elements, and that the modifications and changes are included in the claims of the present invention.

In describing the embodiment of the present invention, detailed description of known function or constitutions will be omitted if they make the gist of the present invention unnecessarily be obscure. In addition, the used terms as terms which are defined in consideration of functions in the embodiment of the present invention may vary depending on the intention or usual practice of a user or an operator. Accordingly, the terms need to be defined base on contents throughout this specification. Accordingly, the detailed description of the invention does not intend to limit the present invention to the disclosed embodiment and it should be interpreted that the appended claims also include other embodiments.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method of outputting a level of a level sensor wherein the level sensor comprises a plurality of electrodes for measuring capacitance, wherein the plurality of electrodes includes an upper electrode and a lower electrode which are disposed adjacent to each other in the level sensor, the method comprising:
    Step (a) of measuring a change in an output value of the lower electrode; and
    Step (b) of measuring a change in an output value of the upper electrode,
    wherein when the measured change in the output value of the lower electrode is less than a predetermined value and the output value of the upper electrode is changed to be equal to or more than the predetermined value, the level of the upper electrode is output.

2. A method of outputting a level of a level sensor wherein the level sensor comprises a plurality of electrodes for measuring capacitance, wherein the plurality of electrodes includes an upper electrode and a lower electrode which are disposed adjacent to each other in the level sensor, the method further comprising:
    (a) measuring a change in an output value of the upper electrode; and
    (b) measuring the change in the output value of the lower electrode,
    wherein when the measured change in the output value of the upper electrode is less than a predetermined value and the output value of the lower electrode is changed to be equal to or more than the predetermined value, the level of the lower electrode is output.

3. The method of claim 1, wherein the level sensor further includes a micro control unit (MCU) receiving measured values from the plurality of electrodes, wherein the MCU periodically measures a change in the output values.

4. The method of claim 2, wherein the level sensor further includes a micro control unit (MCU) receiving measured values from the plurality of electrodes, wherein the MCU periodically measures a change in the output values.

5. The method of claim 1, wherein the plurality of electrodes of the level sensor have predetermined corresponding output values.

6. The method of claim 2, wherein the plurality of electrodes of the level sensor have predetermined corresponding output values.

7. The method of claim 5, wherein a bottom height of each electrode is set as the output value.

8. The method of claim 6, wherein a bottom height of each electrode is set as the output value.

* * * * *